(12) United States Patent
Isobe

(10) Patent No.: US 10,292,275 B2
(45) Date of Patent: May 14, 2019

(54) METHOD OF MANUFACTURING GLASS SUBSTRATE THAT HAS THROUGH HOLE, METHOD OF FORMING THROUGH HOLE IN GLASS SUBSTRATE AND SYSTEM FOR MANUFACTURING GLASS SUBSTRATE THAT HAS THROUGH HOLE

(71) Applicant: AGC Inc., Chiyoda-ku (JP)

(72) Inventor: Mamoru Isobe, Chiyoda-ku (JP)

(73) Assignee: AGC INC., Chiyoda-ku (JP)

( * ) Notice: Subject to any disclaimer, the term of this patent is extended or adjusted under 35 U.S.C. 154(b) by 0 days.

(21) Appl. No.: 15/479,858

(22) Filed: Apr. 5, 2017

(65) Prior Publication Data
US 2017/0295652 A1 Oct. 12, 2017

(30) Foreign Application Priority Data

Apr. 6, 2016 (JP) .................................. 2016-076743
Mar. 31, 2017 (JP) .................................. 2017-072289

(51) Int. Cl.
*H05K 3/40* (2006.01)
*H01L 21/48* (2006.01)
(Continued)

(52) U.S. Cl.
CPC ........... *H05K 3/002* (2013.01); *H01L 21/486* (2013.01); *H01L 23/15* (2013.01); *H05K 1/0306* (2013.01);
(Continued)

(58) Field of Classification Search
None
See application file for complete search history.

(56) References Cited

U.S. PATENT DOCUMENTS 7,084,073 B2 * 8/2006 Lee ..................... B81C 1/00087
438/745
8,894,868 B2 11/2014 Hooper et al.
(Continued)

FOREIGN PATENT DOCUMENTS

JP 2002-161382 6/2002
JP 2003-226551 8/2003
(Continued)

*Primary Examiner* — Allan W. Olsen
(74) *Attorney, Agent, or Firm* — Oblon, McClleland, Maier & Neustadt, L.L.P.

(57) ABSTRACT

A method of manufacturing a glass substrate that has a through hole, includes (1) forming an initial hole in a glass substrate by irradiating laser light from a first surface side of the glass substrate; (2) performing a first etching process using a first etching solution to form, from the initial hole, a first through hole that extends from a first opening formed at a first surface to a second opening formed at a second surface, and to make a ratio "$d_1/R_{t1}$" of a thickness "$d_1$" of the glass substrate with respect to a diameter "$R_{t1}$" of the first opening to be within a range between 10 to 20; and (3) performing a second etching process to enlarge the first through hole using a second etching solution, whose etching rate with respect to the glass substrate is faster than that of the first etching solution.

16 Claims, 3 Drawing Sheets

(51) Int. Cl.
  *H01L 23/498* (2006.01)
  *H05K 1/03* (2006.01)
  *H05K 3/00* (2006.01)
  *H01L 23/15* (2006.01)

(52) U.S. Cl.
  CPC . *H05K 3/0029* (2013.01); *H05K 2201/09827* (2013.01)

(56) References Cited

U.S. PATENT DOCUMENTS

| | | | |
|---|---|---|---|
| 9,656,909 B2* | 5/2017 | Burket | C03C 15/00 |
| 9,802,855 B2* | 10/2017 | Boek | C03B 33/082 |
| 9,953,912 B2* | 4/2018 | Goers | H01L 23/49827 |
| 2003/0150839 A1 | 8/2003 | Kobayashi et al. | |
| 2012/0168412 A1 | 7/2012 | Hooper | |
| 2012/0264296 A1* | 10/2012 | Chern | H01L 21/02057 438/667 |
| 2014/0116091 A1* | 5/2014 | Chuang | C03C 15/00 65/31 |
| 2015/0060402 A1* | 3/2015 | Burkett | B23K 26/006 216/41 |
| 2015/0166395 A1* | 6/2015 | Marjanovic | B23K 26/0057 428/131 |
| 2016/0322291 A1* | 11/2016 | Goers | H01L 21/486 |
| 2017/0103249 A1* | 4/2017 | Jin | G06K 9/00013 |
| 2018/0068868 A1* | 3/2018 | Jaramillo | H01L 21/4807 |

FOREIGN PATENT DOCUMENTS

| | | |
|---|---|---|
| JP | 2007-237221 | 9/2007 |
| JP | 2014-502061 | 1/2014 |
| JP | 2015-501531 | 1/2015 |
| WO | WO 2012/094490 A2 | 7/2012 |

* cited by examiner

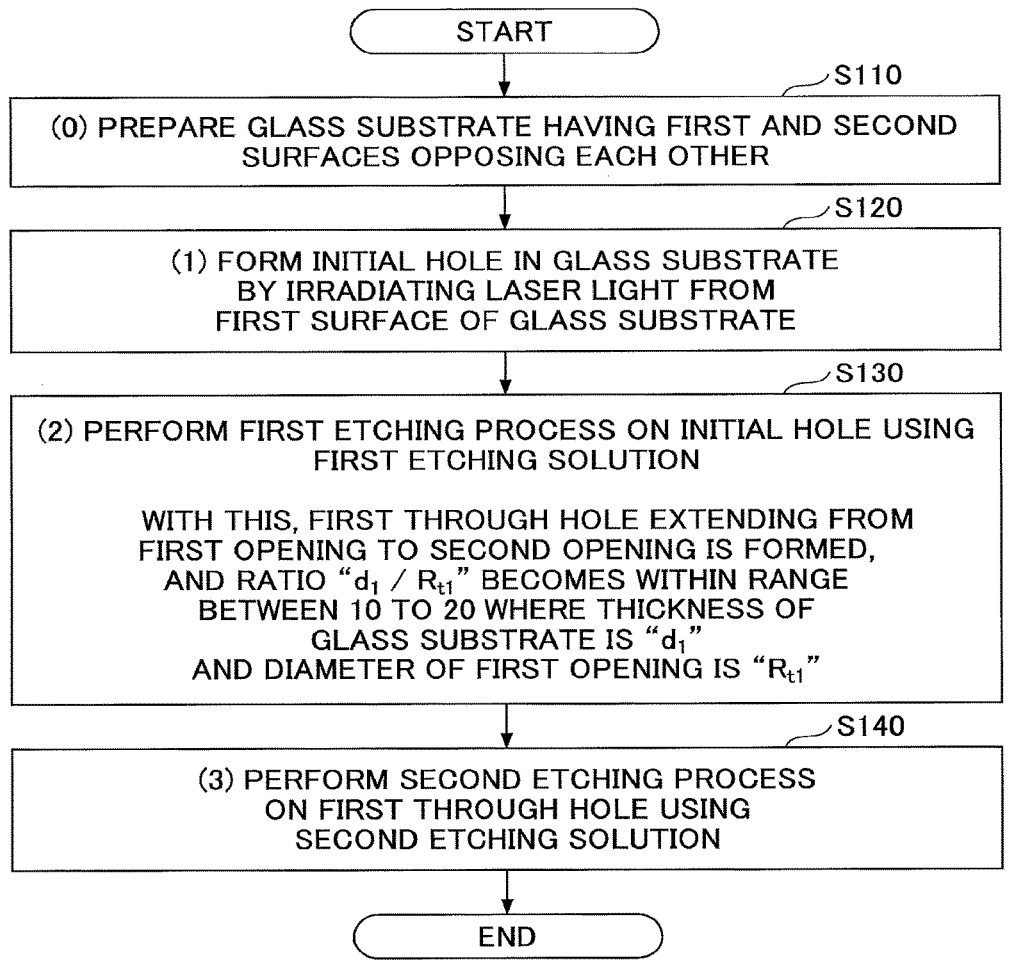
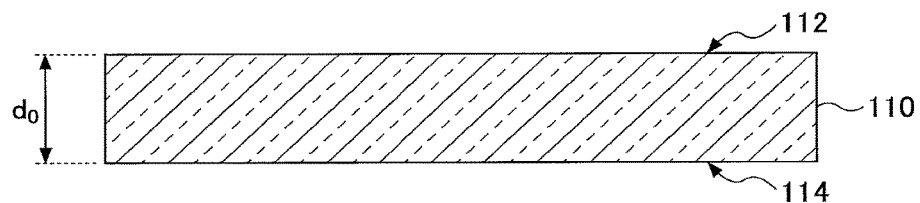

METHOD OF MANUFACTURING GLASS SUBSTRATE THAT HAS THROUGH HOLE, METHOD OF FORMING THROUGH HOLE IN GLASS SUBSTRATE AND SYSTEM FOR MANUFACTURING GLASS SUBSTRATE THAT HAS THROUGH HOLE

CROSS-REFERENCE TO RELATED APPLICATION

The present application is based on and claims the benefit of priority of Japanese Priority Applications No. 2016-076743 filed on Apr. 6, 2016, and No. 2017-072289 filed on Mar. 31, 2017, the entire contents of which are hereby incorporated by reference.

BACKGROUND OF THE INVENTION

1. Field of the Invention

The present invention relates to a method of manufacturing a glass substrate that has a through hole, a method of forming a through hole in a glass substrate and a system for manufacturing a glass substrate that has a through hole.

2. Description of the Related Art

Conventionally, a technique to form one or more through holes in a glass substrate by irradiating laser light generated from a laser light source to the glass substrate is known (for example, Patent Document 1).

The glass substrate that has such through holes is used in a glass interposer or the like in which conductive filler fills in each of the through holes, for example.

Generally, the glass substrate that has such through holes is prepared by, (1) a step of preparing a glass substrate that has first and second surfaces, (2) a step of forming a through hole that penetrates from a first opening at the first surface to a second opening at the second surface by irradiating laser light on a first surface side of the glass substrate, and (3) a step of enlarging the through hole by performing a wet etching process on the glass substrate in order to obtain a through hole of a desired size.

However, when performing the step of (3), a problem may occur that a narrow portion is formed at a substantially center of the through hole in a longitudinal direction of the through hole.

This is because, generally, the diameter of the through hole formed in the step of (2) is relatively small compared with the thickness of the glass substrate. This means, when the wet etching process is performed on such a "fine" through hole in the step of (3), etching solution does not diffuse enough in the through hole, and also a product generated by an etching reaction remains in the through hole. As a result, it is difficult to sufficiently achieve the etching reaction in the through hole, and the narrow portion is generated.

In particular, for a glass interposer, an extremely fine through hole is formed in the step of (2). Thus, there is a problem that such a narrow portion is easily generated in the through hole in the glass interposer.

PATENT DOCUMENT

[Patent Document 1] Japanese Laid-open Patent Publication No. 2003-226551

SUMMARY OF THE INVENTION

The present invention is made in light of the above problems, and provides a method of manufacturing a glass substrate that has a through hole with a desired shape, a method of forming a through hole with a desired shape in a glass substrate and a system for manufacturing a glass substrate that has a through hole with a desired shape.

According to an embodiment, there is provided a method of manufacturing a glass substrate that has a through hole, including (1) forming an initial hole in a glass substrate, having first and second surfaces opposing each other, by irradiating laser light from a first surface side of the glass substrate; (2) performing a first etching process on the glass substrate using a first etching solution to form, from the initial hole, a first through hole that extends from a first opening formed at the first surface to a second opening formed at the second surface, and to make a ratio "$d_1/R_{t1}$" of a thickness "$d_1$" of the glass substrate with respect to a diameter "$R_{t1}$" of the first opening to be within a range between 10 to 20; and (3) after performing the step (2), performing a second etching process on the glass substrate to enlarge the first through hole using a second etching solution, whose etching rate with respect to the glass substrate is faster than an etching rate of the first etching solution with respect to the glass substrate.

According to another embodiment, there is provided a method of forming a through hole in a glass substrate, including (1) forming an initial hole in a glass substrate, having first and second surfaces opposing each other, by irradiating laser light from a first surface side of the glass substrate; (2) performing a first etching process on the glass substrate using a first etching solution to form, from the initial hole, a first through hole that extends from a first opening formed at the first surface to a second opening formed at the second surface, and to make a ratio "$d_1/R_{t1}$" of a thickness "$d_1$" of the glass substrate with respect to a diameter "$R_{t1}$" of the first opening to be within a range between 10 to 20; and (3) after performing the step (2), performing a second etching process on the glass substrate to enlarge the first through hole using a second etching solution, whose etching rate with respect to the glass substrate is faster than an etching rate of the first etching solution with respect to the glass substrate.

According to another embodiment, there is provided system for manufacturing a glass substrate that has a through hole, including: a laser processing system that forms an initial hole in a glass substrate by irradiating laser light on the glass substrate; an etching system that forms a through hole from the initial hole by etching the glass substrate in which the initial hole is formed, the etching system including a first etching system that performs a first etching process using a first etching solution, and a second etching system that performs a second etching process using a second etching solution, whose etching rate with respect to the glass substrate is faster than an etching rate of the first etching solution with respect to the glass substrate, the etching system being configured to perform the second etching process by the second etching system after performing the first etching process by the first etching system.

BRIEF DESCRIPTION OF THE DRAWINGS

Other objects, features and advantages of the present invention will become more apparent from the following detailed description when read in conjunction with the accompanying drawings.

FIG. 3 is a flowchart illustrating an example of a method of manufacturing a glass substrate that has a through hole of an embodiment;

FIG. 4 is a cross-sectional view schematically illustrating the method of manufacturing the glass substrate that has the through hole illustrated in FIG. 3 of the embodiment;

DETAILED DESCRIPTION OF THE PREFERRED EMBODIMENTS

Figure 1:
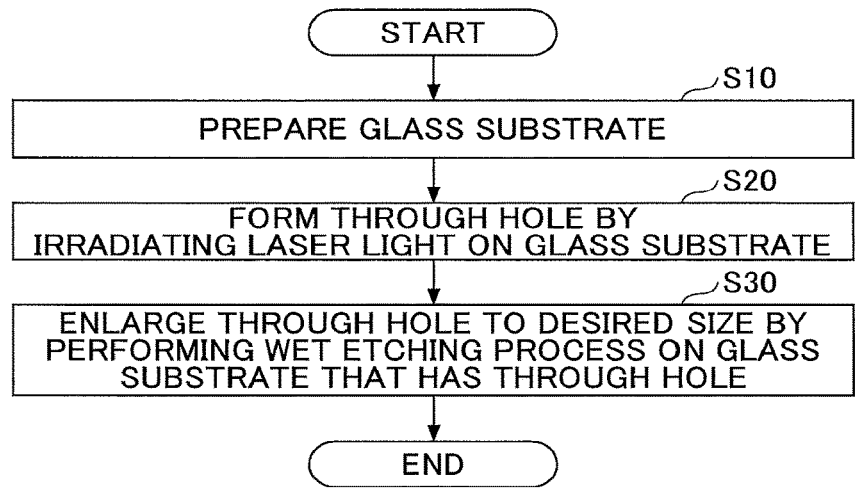
FIG. 1 is a flowchart illustrating a conventional method of manufacturing a glass substrate that has a through hole.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

(Conventional Method of Manufacturing Glass Substrate that has Through Hole)

In order to facilitate understanding of an embodiment of the present invention, first, a conventional method of manufacturing a glass substrate that has a through hole is described with reference to FIG. 1 and FIG. 2.

FIG. 1 is a flowchart schematically illustrating a conventional method of manufacturing a glass substrate that has a through hole (hereinafter, simply referred to as a "conventional manufacturing method"). FIG. 2 schematically illustrates steps of the conventional manufacturing method illustrated in FIG. 1.

As illustrated in FIG. 1, the method of manufacturing the glass substrate includes a step of preparing a glass substrate (step S10), a step of forming a through hole in the glass substrate by irradiating laser light (step S20), and a step of enlarging the through hole by performing a wet etching process on the glass substrate that has the through hole in order to obtain a through hole of a desired size (step S30).

Figure 2:
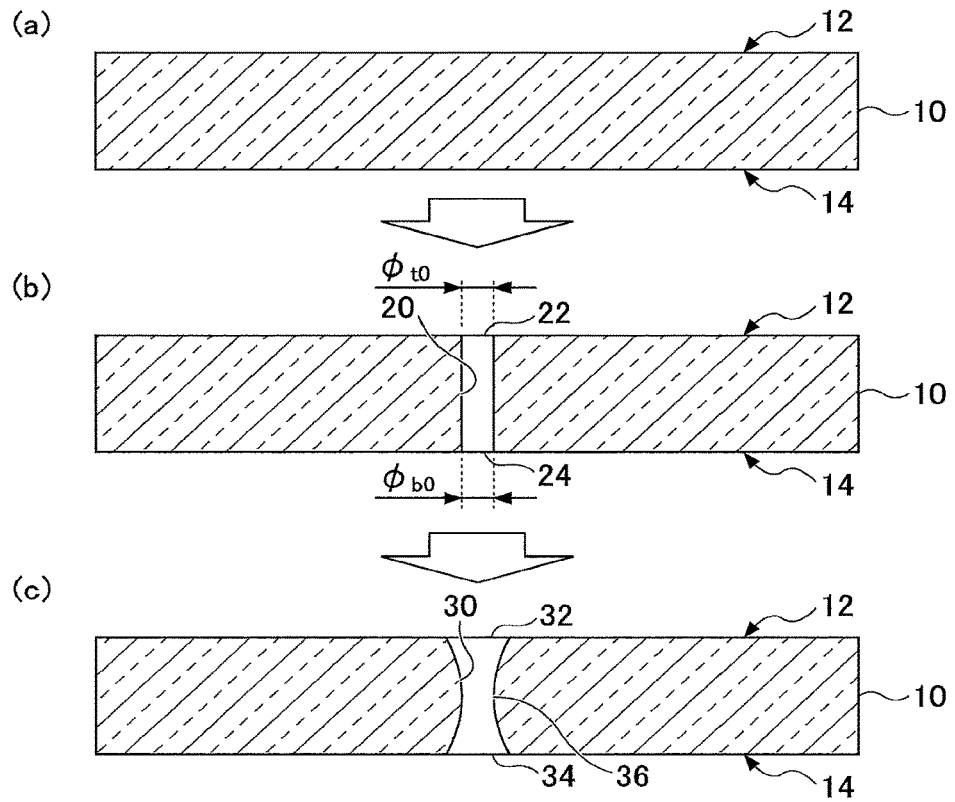
FIG. 2 is a cross-sectional views schematically illustrating the conventional method of manufacturing the glass substrate that has the through hole illustrated in FIG. 1.

In step S10, as illustrated in (a) of FIG. 2, a glass substrate 10 that has a first surface 12 and a second surface 14 is prepared.

Next, in step S20, as illustrated in (b) of FIG. 2, a through hole 20 is formed in the glass substrate 10. The through hole 20 is formed by irradiating laser light (not illustrated in the drawings) from a first surface 12 side of the glass substrate 10.

The through hole 20 includes a first opening 22 at the first surface 12 of the glass substrate 10, and a second opening 24 at the second surface 14 of the glass substrate 10. The diameter of the first opening 22 is "$\varphi_{t0}$", and the diameter of the second opening 24 is "$\varphi_{b0}$".

Next, in step S30, in order to enlarge the diameter of the through hole 20 to a desired size, a wet etching process is performed on the glass substrate 10.

Here, when the diameter "$\varphi_{t0}$" of the first opening 22 (or the diameter "$\varphi_{b0}$" of the second opening 24) of the through hole 20 formed in step S20 is large enough, an etching solution can be uniformly and sufficiently provided over the entire length of the through hole 20 during the wet etching process. Thus, the through hole 20 cab be relatively uniformly enlarged.

However, if the through hole 20 is a fine through hole whose diameter "$\varphi_{t0}$" of the first opening 22 and diameter "$\varphi_{b0}$" of the second opening 24 are small, it is difficult to sufficiently achieve an etching reaction in the fine through hole 20 during the wet etching process. This is because the etching solution does not diffuse enough in the through hole 20, and also a product generated by the etching reaction tends to remain in the through hole 20. Further, it may be difficult to sufficiently provide the etching solution into such a fine through hole 20.

Thus, while enlarging the through hole 20, the glass substrate 10 is selectively etched near the first and second openings 22 and 24. In other words, it is difficult to enlarge the through hole 20 enough, in particular at a center portion of the through hole 20, by the etching process.

As a result, after step S30, as illustrated in (c) of FIG. 2, an enlarged through hole 30 having a so-called "sandglass shape" cross-section is formed. This means that although each of the first opening 32 and the second opening 34 may have a desired size, the enlarged through hole 30 is formed to have a narrow portion 36 whose size is smaller than the desired size.

As such, according to the conventional manufacturing method, in particular, when the diameter of the through hole 20 ($\varphi_{t0}$, $\varphi_{b0}$) is relatively smaller with respect to the thickness of the glass substrate 10, there is a problem that the enlarged through hole 30 has the distinguishing narrow portion 36.

(Method of Manufacturing Glass Substrate that has Through Hole of Embodiment)

Next, with reference to FIG. 3 to FIG. 7, an example of a method of manufacturing a glass substrate that has a through hole of the embodiment is described.

FIG. 3 is a flowchart schematically illustrating an example of the method of manufacturing the glass substrate that has the through hole of the embodiment. FIG. 4 to FIG. 7 are cross-sectional views schematically illustrating steps of the method of manufacturing the glass substrate that has the through hole of the embodiment.

As illustrated in FIG. 3, the method of manufacturing the glass substrate that has the through hole of the embodiment (hereinafter, referred to as a "first manufacturing method") includes (0) a step of preparing a glass substrate having first and second surfaces opposing each other (step S110), (1) a step of forming an initial hole in the glass substrate by irradiating laser light from a first surface side of the glass substrate (step S120), (2) a step of performing a first etching process on the glass substrate to enlarge the initial hole using a first etching solution to form a first through hole that extends from a first opening to a second opening in the glass substrate, and to make a ratio "$d_1/R_{t1}$" of a thickness "$d_1$" of the glass substrate with respect to a diameter "$R_{t1}$" of the first opening to be within a range between 10 to 20 (step S130), and (3) a step of performing a second etching process on the glass substrate to enlarge the first through hole using a second etching solution (step S140).

The steps are respectively described in detail with reference to FIG. 4 to FIG. 7.

(Step S110)

First, a glass substrate 110 having a cross-sectional shape as illustrated in FIG. 4 is prepared. The glass substrate 110 has a first surface 112 and a second surface 114 that are opposing each other. The glass substrate 110 has an initial thickness "$d_0$".

The initial thickness "$d_0$" may be between 0.1 mm to 0.7 mm, more preferably, between 0.2 mm to 0.5 mm, and furthermore preferably, between 0.3 mm to 0.5 mm, for example. Advantages of using the first manufacturing method of the embodiment can be particularly obtained for the glass substrate 110 whose initial thickness "$d_0$" is greater than or equal to 0.3 mm. However, the initial thickness "$d_0$" of the glass substrate 110 is not limited to this range.

The composition of the glass substrate 110 is not specifically limited. The glass substrate 110 may be a soda-lime glass, an alkali-free glass or the like, for example.

(Step S120)

Next, by irradiating laser light from a first surface 112 side of the glass substrate 110, one or more initial holes are formed in the glass substrate 110.

As long as the initial hole is formed in the glass substrate 110, a kind of the laser light or an irradiating condition of the laser light is not specifically limited. The laser light may be a $CO_2$ laser, a UV laser or the like, for example. Further, the laser light may be oscillated from a short pulse laser (a picosecond laser, a femtosecond laser, for example) or the like.

A configuration of the initial hole is not specifically limited, and the initial hole may be a through hole or a non-through hole. Further, the initial hole may be a line of voids composed of a plurality of voids aligned along a thickness direction of the glass substrate 110. When the short pulse laser is used, the line of voids is easily formed as the initial hole.

Figure 5:
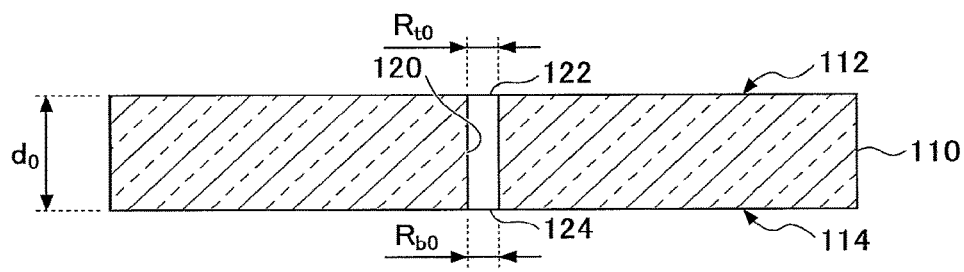
FIG. 5 is a cross-sectional view schematically illustrating the method of manufacturing the glass substrate that has the through hole illustrated in FIG. 3 of the embodiment.

FIG. 5 schematically illustrates a state in which an initial hole 120 is formed in the glass substrate 110. Here, as the initial hole 120 illustrated in FIG. 5 is a through hole, the initial hole 120 is referred to as an "initial through hole" 120 hereinafter.

As illustrated in FIG. 5, the initial through hole 120 extends from a first initial opening 122 formed at the first surface 112 of the glass substrate 110 to a second initial opening 124 formed at the second surface 114 of the glass substrate 110. For the initial through hole 120, the diameter of the first initial opening 122 is referred to as "$R_{t0}$" and the diameter of the second initial opening 124 is referred to as "$R_{b0}$".

Here, a ratio "$d_0/R_{t0}$" of the thickness "$d_0$" of the glass substrate 110 at this step, with respect to the diameter "$R_{t0}$" of the first initial opening 122 is greater than or equal to 25, for example. It is preferable that the ratio "$d_0/R_{t0}$" is greater than or equal to 30. Advantages of using the first manufacturing method of the embodiment can be particularly obtained when the ratio "$d_0/R_{t0}$" is greater than or equal to 25, compared with the conventional manufacturing method. This means that when the ratio "$d_0/R_{t0}$" is greater than or equal to 25, according to the conventional manufacturing method, a distinguishing narrow portion is generated in the through hole by the etching step. However, according to the first manufacturing method, generation of such a narrow portion can be significantly suppressed.

The diameter "$R_{t0}$" of the first initial opening 122 is less than or equal to 15 µm, and may be less than or equal to 13 µm, for example.

Here, for the example illustrated in FIG. 5, the diameter "$R_{t0}$" of the first initial opening 122 and the diameter "$R_{b0}$" of the second initial opening 124 are illustrated to have substantially the same size for a simplification purpose. However, it should be noted that the initial through hole 120 formed by irradiating the laser light may actually have a tapered shape whose diameter gradually reduces from the first initial opening 122 toward the second initial opening 124. Thus, generally, the diameter "$R_{t0}$" is larger than the diameter "$R_{b0}$".

Although only one initial through hole 120 is illustrated in FIG. 5, a plurality of the initial through holes 120 may be formed in the glass substrate 110.

(Step S130)

Next, in order to enlarge the diameter of the initial through hole 120, a first etching process (referred to as a "first etching step" as well) using a first etching solution is performed on the initial through hole 120.

As long as the initial through hole 120 can be appropriately enlarged (as long as the glass substrate 110 is appropriately etched), a kind of the first etching solution is not particularly limited. For example, the first etching solution may be an acidic solution containing hydrofluoric acid. Further, the first etching solution may be a mixed acidic solution containing at least one other acid in addition to hydrofluoric acid. For example, the first etching solution may be a mixed acidic solution of hydrofluoric acid and hydrochloric acid, or a mixed acidic solution of hydrofluoric acid and nitric acid.

An etching rate "$V_1$" of the first etching solution with respect to the glass substrate 110 in the first etching process is less than or equal to 0.5 µm/minute, for example, preferably, less than or equal to 0.2 µm/minute, and more preferably, less than or equal to 0.02 µm/minute.

The first etching step may be performed at any appropriate temperature, and process temperature may be room temperature, for example.

The first etching step may be performed by selectively providing the first etching solution in the initial through hole 120, for example (hereinafter, this method is referred to as a "partial etching process (method)"). According to the partial etching process, the diameter of the initial through hole 120 can be enlarged without varying the thickness of the glass substrate 110. According to the partial etching process, for example, etching may be performed after providing an etching protection film that does not cover the initial through hole 120.

Alternatively, the first etching step may be performed under a condition that the entirety of the glass substrate 110 is exposed to the first etching solution (hereinafter, this method is referred to as an "entire etching process (method)"). For example, the first etching step may be performed by dipping the glass substrate 110 that has the initial through hole 120 in a bath containing the first etching solution (dipping method). Alternatively, the first etching step may be performed by directly providing the first etching solution to the glass substrate 110 (showering method).

According to the entire etching process, the thickness of the glass substrate 110 is also changed (reduced) from "$d_0$" to "$d_1$".

Further, in the first etching step, supersonic waves may be applied to the glass substrate 110, the glass substrate 110 may be oscillated, or the etching solution may be bubbled. With this, the etching can be more uniformly performed.

Hereinafter, a case in which the first etching step is performed by the entire etching process is described as an example.

Figure 6:
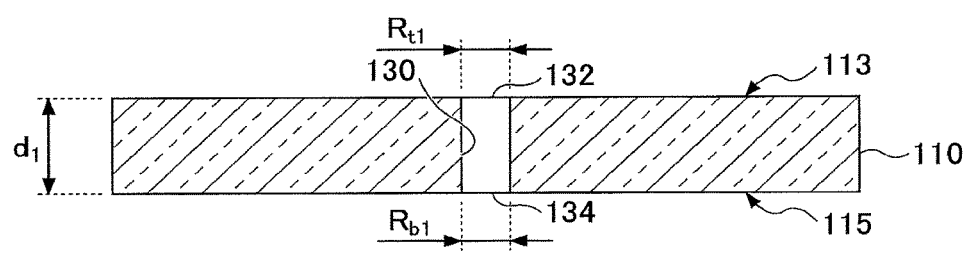
FIG. 6 is a cross-sectional view schematically illustrating the method of manufacturing the glass substrate that has the through hole illustrated in FIG. 3 of the embodiment.

FIG. 6 schematically illustrates a cross-section of the glass substrate 110 after the first etching step of the entire etching process is performed.

As illustrated in FIG. 6, the thickness of the glass substrate 110 is reduced to "$d_1$" by the first etching step. In other words, the glass substrate 110 is made to include a newly generated first surface 113 and a newly generated second surface 115.

Further, the initial through hole 120 is changed (enlarged) to be a first through hole 130. The first through hole 130 extends from a first opening 132 formed at the newly generated first surface 113 to a second opening 134 formed at the newly generated second surface 115.

Here, the first manufacturing method has a feature that a ratio "$d_1/R_{t1}$" is within a range between 10 to 20, where the diameter of the first opening 132 is "$R_{t1}$". It is preferable that the ratio "$d_1/R_{t1}$" is within a range between 10 to 15.

By setting the ratio "$d_1/R_{t1}$" to be within such a range, generation of a narrow portion in a through hole can be significantly suppressed in a following step S140.

In other words, by enlarging the initial through hole 120 such that the ratio "$d_1/R_{t1}$" becomes less than or equal to 20 in the first etching step, generation of a distinguishing narrow portion in the enlarged first through hole 130 can be suppressed in the second etching step.

Here, even when the first etching step is performed until the ratio "$d_1/R_{t1}$" becomes less than 10, that does not influence generation of the distinguishing narrow portion in the second etching step. Thus, in order to shorten the process period for the first etching step, the ratio "$d_1/R_{t1}$" may be greater than or equal to 10.

Here, the newly generated first surface 113 of the glass substrate 110 formed by the entire etching process is referred to as a "surface corresponding to the first surface of the glass substrate" as well. Similarly, the newly generated second surface 115 of the glass substrate 110 formed by the entire etching process is referred to as a "surface corresponding to the second surface of the glass substrate" as well. However, the newly generated first surface 113 and the newly generated second surface 115 are also referred to as the first surface and the second surface, respectively.

(Step S140)

Next, in order to further enlarge the diameter of the first through hole 130, in other words, in order to enlarge the diameter of the through hole to a desired diameter, a second etching process using a second etching solution (hereinafter, referred to as "second etching step" as well) is performed on the first through hole 130.

Similar to the above described first etching step, the second etching step may be performed by the partial etching process or by the entire etching process. Further, the first etching step and the second etching step may be performed by the same etching process, or different etching processes. For example, the first etching step may be performed by the dipping method, while the second etching step may be performed by the showering method. As the process period for the first etching step becomes relatively long, it is preferable to perform the first etching step by the dipping method from a viewpoint of productivity (cost). On the other hand, it is preferable to perform the second etching step by the showering method because it is possible to adjust the size of the hole while suppressing the decreasing of the thickness of the glass substrate 110.

Here, a case in which the second etching step is performed by the entire etching process is described as an example.

According to the entire etching process, the second etching step may be performed by dipping the glass substrate 110 that has the first through hole 130 in a bath containing the second etching solution, for example. With this, the thickness of the glass substrate 110 is changed (reduced) from "$d_1$" to "$d_2$".

The second etching solution may be an acidic solution containing hydrofluoric acid, for example. The second etching solution may be a mixed acidic solution containing at least one other acid in addition to hydrofluoric acid. The mixed acidic solution may be the same kind as the first etching solution. The concentrations of the first etching solution and the second etching solution may be different. The second etching step may be performed at any appropriate temperature, and the process temperature may be room temperature, for example.

Here, the second etching solution is selected from etching solutions whose etching rates with respect to the glass substrate 110 are faster than that of the first etching solution.

For example, an etching rate "$V_2$" of the second etching solution with respect to the glass substrate 110 in the second etching process may be greater than or equal to three times of the etching rate "$V_1$" of the first etching solution with respect to the glass substrate 110, preferably, greater than or equal to 10 times of the etching rate "$V_1$", and more preferably, greater than or equal to 100 times of the etching rate "$V_1$". For example, the etching rate "$V_2$" of the second etching solution with respect to the glass substrate 110 may be less than or equal to 5.0 µm/minute, preferably, less than or equal to 2.0 µm/minute, and more preferably, less than or equal to 1.5 µm/minute. The etching rate "$V_2$" may be within a range between 1.0 µm/minute to 1.5 µm/minute, for example.

Figure 7:
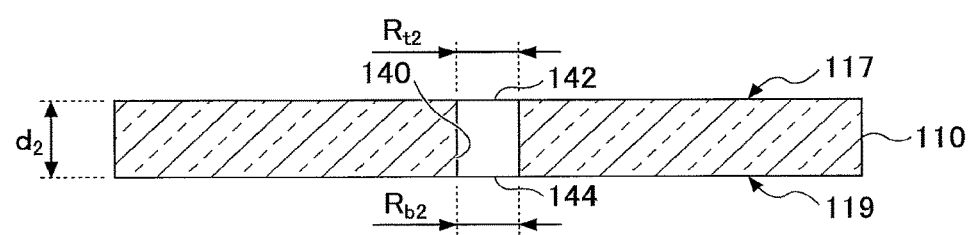
FIG. 7 is a cross-sectional view schematically illustrating the method of manufacturing the glass substrate that has the through hole illustrated in FIG. 3 of the embodiment.

FIG. 7 schematically illustrates a cross-sectional view of the glass substrate 110 after the second etching step is performed.

As illustrated in FIG. 7, the thickness of the glass substrate 110 is varied to "$d_2$" by the second etching step. In other words, the glass substrate 110 is made to include a newly generated third surface 117 (corresponding to the first surface) and a newly generated fourth surface 119 (corresponding to the second surface).

Further, the first through hole 130 is changed (enlarged) to a second through hole 140. The second through hole 140 extends from a third opening 142 formed at the newly generated third surface 117 to a fourth opening 144 formed at the newly generated fourth surface 119.

After performing the above described steps, the glass substrate 110 in which the second through hole 140 having a desired size is formed can be manufactured.

Here, according to the first manufacturing method, the through hole (second through hole 140) is formed by performing at least two etching steps including the first etching step and the second etching step.

Among them, according to the first etching step, the etching using the first etching solution whose etching rate "$V_1$" is relatively slow is performed to enlarge the initial through hole 120.

As the etching rate "$V_1$" of the first etching solution is relatively slow, a relatively long etching period is necessary for the first etching process. Thus, the concentration diffusion of the first etching solution in the initial through hole 120 becomes relatively fast.

In other words, as the etching rate "$V_1$" of the first etching solution with respect to the glass substrate 110 is relatively slow, the first etching solution can be comparatively rapidly diffused in the initial through hole 120 with respect to an etching speed of the glass substrate 110 near the first initial opening 122 and the second initial opening 124. Thus, a difference between a degree of etching of the glass substrate 110 near the first initial opening 122 and the second initial opening 124 and a degree of etching of the glass substrate 110 near a center portion of the initial through hole 120 becomes small. With this, a product generated by the etching reaction can easily move outside from the initial through hole 120, and the product remaining in the initial through hole 120 is significantly suppressed.

Thus, the diameter of the initial through hole 120 can be sufficiently enlarged while suppressing the significant generation of a narrow portion in the initial through hole 120 by the first etching step.

Next, according to the second etching step, the second etching solution whose etching rate "$V_2$" is relatively large is used.

Here, as described above, the initial through hole 120 is sufficiently enlarged by the first etching step. Thus, the second etching solution can be relatively rapidly and uniformly diffused in the first through hole 130 in the second etching step. Further, a product generated by the etching reaction can rapidly move outside from the first through hole 130, so that the product remaining in the first through hole 130 is significantly suppressed.

Thus, the first through hole 130 is relatively uniformly enlarged, and a distinguishing narrow portion is not generated in the first through hole 130 by the second etching step.

As a result, according to the first manufacturing method, compared with a conventional method in which the initial through hole is enlarged by a single etching step, generation of a narrow portion can be significantly suppressed, and a through hole having a relatively desired shape can be formed.

Advantages of using the first manufacturing method of the embodiment can be particularly obtained when an initial hole (line of voids) having a relatively high aspect ratio is formed by using a UV laser, a short pulse laser or the like. This is because when the aspect ratio of the initial hole is high, the etching solution cannot be easily uniformly dispersed in the initial hole, and it is difficult to provide the etching solution inside the initial hole.

An example of the method of manufacturing the glass substrate that has the through hole is described with reference to FIG. 3 to FIG. 7 above. However, the present invention is not limited to the specifically disclosed embodiments, and numerous variations and modifications may be made without departing from the spirit and scope of the present invention.

For example, the initial through hole 120 is formed in the step S120 as the initial hole according to the above described description. However, the initial hole may be a non-through hole, or a line of voids composed of a plurality of voids aligned in the thickness direction of the glass substrate. In such a case, a through hole is formed after performing the first etching step, and the through hole is further enlarged by the second etching step.

Further, according to the above described description, the first manufacturing method includes two etching steps. However, according to an example of the method of manufacturing the glass substrate that has the through hole of the embodiment, three or more etching steps may be performed. In such a case, a first etching solution with a relatively slow etching rate may be used in a first etching step, a second etching solution with an etching rate about medium may be used in a second etching step, and a third etching solution with a relatively fast etching rate may be used in a third etching step.

Further, the above described method of manufacturing the glass substrate that has the through hole may be applied to a method of forming a through hole in a glass substrate.

(Another Example of Method of Manufacturing Glass Substrate that has Through Hole)

Another method of manufacturing a glass substrate that has a through hole of the embodiment, includes (1) a step of forming an initial hole in a glass substrate, having first and second surfaces opposing each other, by irradiating laser light from a first surface side of the glass substrate, (2) a step of performing a first wet etching process on the glass substrate to enlarge the initial hole using a first etching solution to form a first through hole that extends from the first surface (or a surface of the glass substrate corresponding to the first surface) to the second surface (or a surface of the glass substrate corresponding to the second surface), and (3) a step of performing a second wet etching process on the glass substrate using a second etching solution, whose etching rate with respect to the glass substrate is faster than an etching rate of the first etching solution with respect to the glass substrate, to enlarge the first through hole to form a second through hole.

As described above, when the etching rate of the second etching solution with respect to the glass substrate is faster than the etching rate of the first etching solution with respect to the glass substrate, a through hole with a relatively desired shape can be formed. In particular, as the initial hole whose aspect ratio is relatively high is formed when a UV laser or a short pulse laser is used, advantages can be obtained by adopting the method of the embodiment.

The above described method of manufacturing the glass substrate that has the through hole may be applied to a method of forming a through hole in a glass substrate.

According to the embodiment, structures of the embodiment as described above with reference to FIG. 3 to FIG. 7 can be arbitrarily combined. As the above description can be arbitrarily applied, specific structures are not described in detail again.

(Example of System for Manufacturing Glass Substrate that has Through Hole)

A system for manufacturing a glass substrate that has a through hole of the embodiment, includes a laser processing system that forms an initial hole in a glass substrate by irradiating laser light on the glass substrate, an etching system that forms a through hole by etching the glass substrate to enlarge the initial hole, wherein the etching system includes a first etching system that performs a first etching process using a first etching solution, and a second etching system that performs a second etching process using a second etching solution, whose etching rate with respect to the glass substrate is faster than an etching rate of the first etching solution with respect to the glass substrate, and wherein the etching system is configured to perform the second etching process by the second etching system after performing the first etching process by the first etching system.

The laser processing system may include a UV laser. Further, the laser processing system may include a short pulse laser such as a picosecond laser or a femtosecond laser.

As described above, when the etching rate of the second etching solution with respect to the glass substrate is faster than the etching rate of the first etching solution with respect to the glass substrate, a through hole with a relatively desired shape can be formed. In particular, as the initial hole whose aspect ratio is relatively high is formed when UV laser or short pulse laser is used, advantages can be obtained by adapting the method of the embodiment.

The etching system may further include a washing system. A washing process by the washing system may be performed between the first etching process by the first etching system and the second etching process by the second etching system. As the concentration of the etching solutions are different between the first etching process and the second etching process, it is preferable that the glass substrate is washed between the first etching process and the second etching process. For the washing process, pure water may be used, for example.

The above described system may be used for a method of forming a through hole in a glass substrate as well.

According to the embodiment, structures of the embodiment as described above with reference to FIG. 3 to FIG. 7 can be arbitrarily combined. As the above description can be arbitrarily applied, specific structures are not described in detail again.

EXAMPLES

Examples of the embodiment are described. In the following description, example 1 to example 4 are working examples of the embodiment, and example 5 is a comparative example.

Example 1

A glass substrate having a through hole of a desired size was manufactured by the following method.
(Irradiation of Laser Light)
First, a glass substrate (alkali-free glass substrate) with a length of 50 mm×a width of 50 mm×a thickness ($d_0$) of 400 μm was prepared.

Next, UV laser light was irradiated from a first surface (one of surfaces with a length of 50 mm×a width of 50 mm) side of the glass substrate to form an initial through hole. The diameter "$R_{t0}$" of a first initial opening of the initial through hole at the first surface was approximately 13 μm, and the diameter "$R_{b0}$" of a second initial opening of the initial through hole at a second surface, opposing to the first surface, was approximately 3 μm. Thus, the ratio "$d_0/R_{t0}$" of the glass substrate was approximately 30.8.
(First Etching Step)
Next, the first etching process was performed on the obtained glass substrate.

The first etching solution was 0.4 wt % hydrofluoric acid solution. The first etching process was performed by dipping the glass substrate in the hydrofluoric acid solution for 80 minutes. The process temperature was room temperature. The glass substrate was etched under a static state (without applying oscillation).

With this, the glass substrate was etched and the initial through hole was enlarged to obtain a first through hole. The surfaces of the glass substrate were also etched and the thickness became "$d_1$"=390 μm.

The diameter "$R_{t1}$" of the first opening of the first through hole at the first surface of the glass substrate was 25.1 μm, and the diameter "$R_{b1}$" of the second opening of the first through hole at the second surface of the glass substrate was 10.4 μm. Thus, the ratio "$d_1/R_{t1}$" was approximately 15.6.
(Second Etching Step)
Next, the second etching process was performed on the glass substrate.

The second etching solution was 2 wt % hydrofluoric acid solution. The second etching process was performed by dipping the glass substrate in the hydrofluoric acid solution for 25 minutes. The process temperature was room temperature. The glass substrate was etched under a static state (without applying oscillation). The etching rate "$V_2$" of the second etching solution was approximately 10 times of the etching rate "$V_1$" of the first etching solution.

With this, the glass substrate was etched and the first through hole was enlarged to obtain a second through hole. The surfaces of the glass substrate were also etched, and the thickness became "$d_2$"=360 μm.

The diameter "$R_{t2}$" of the third opening of the second through hole at the first surface of the glass substrate was 46.3 μm, and the diameter "$R_{b2}$" of the fourth opening at the second surface of the glass substrate was 33.8 μm. Thus, the ratio "$d_2/R_{t2}$" was approximately 7.8.

Example 2

By the method similar to example 1, a glass substrate having a through hole of a desired size was manufactured.

However, in example 2, the etching period by the first etching solution in the first etching step was 120 minutes. Further, the etching period by the second etching solution in the second etching step was 21 minutes.

The thickness "$d_1$" of the glass substrate after the first etching step was "$d_1$"=385 μm. Further, the diameter "$R_{b1}$" of the first opening of the first through hole at the first surface was 28.7 μm, and the diameter "$R_{b1}$" of the second opening of the first through hole at the second surface was 15.6 μm. Thus, the ratio "$d_1$/"$R_{t1}$" was approximately 13.4.

Then, the thickness "$d_2$" of the glass substrate after performing the second etching step was "$d_2$"=360 μm. The diameter "$R_{t2}$" of the third opening of the second through hole at the first surface of the glass substrate was 46.0 μm, and the diameter "$R_{b2}$" of the fourth opening of the second through hole at the second surface of the glass substrate was 34.3 μm. Thus, the ratio "$d_2/R_{t2}$" was approximately 7.8.

Example 3

By the method similar to example 1, a glass substrate having a through hole of a desired size was manufactured.

Here, in example 3, the etching period by the first etching solution in the first etching step was 210 minutes. Further, the etching period by the second etching solution in the second etching step was 8 minutes.

The thickness "$d_1$" of the glass substrate after performing the first etching step was "$d_1$"=370 μm. The diameter "$R_{t1}$" of the first opening of the first through hole at the first surface of the glass substrate was 36.8 μm, and the diameter "$R_{b1}$" of the second opening of the first through hole at the second surface of the glass substrate was 23.1 μm. Thus, the ratio "$d_1/R_{t1}$" was approximately 10.

Then, the thickness "$d_2$" of the glass substrate after performing the second etching step was "$d_2$"=360 µm. The diameter "$R_{t2}$" of the third opening of the second through hole at the first surface of the glass substrate was 46.4 µm, and the diameter "$R_{b2}$" of the fourth opening of the second through hole at the second surface of the glass substrate was 33.3 µm. Thus, the ratio "$d_2/R_{t2}$" was approximately 7.8.

Example 4

By the method similar to example 1, a glass substrate having a through hole of a desired size was manufactured.

Here, in example 4, the etching period by the first etching solution in the first etching step was 40 minutes. Further, the etching period by the second etching solution in the second etching step was 30 minutes.

The thickness "$d_1$" of the glass substrate after performing the first etching step was approximately 395 µm. The diameter "$R_{t1}$" of the first opening of the first through hole at the first surface of the glass substrate was 18.9 µm, and the diameter "$R_{b1}$" of the second opening of the first through hole at the second surface of the glass substrate was 7.6 µm. Thus, the ratio "$d_1/R_{t1}$" was approximately 20.9.

Then, the thickness "$d_2$" of the glass substrate after performing the second etching step was "$d_2$"=360 µm. The diameter "$R_{t2}$" of the third opening of the second through hole at the first surface of the glass substrate was 45.6 µm, and the diameter "$R_{b2}$" of the fourth opening of the second through hole at the second surface of the glass substrate was 34.0 µm. Thus, the ratio "$d_2/R_{t2}$" was approximately 7.9.

Example 5

By the method similar to example 1, a glass substrate having a through hole was manufactured.

Here, in example 5, the first etching step was not performed. This means that only the second etching step was performed on the glass substrate after forming the initial through hole in the glass substrate by irradiating the UV laser light. The etching period by the second etching solution in the second etching step was 33 minutes.

The thickness "$d_2$" of the glass substrate after performing the second etching step was "$d_2$"=360 µm. The diameter "$R_{t2}$" of the third opening of the second through hole at the first surface of the glass substrate was 45.6 µm, and the diameter "$R_{b2}$" of the fourth opening of the second through hole at the second surface of the glass substrate was 32.7 µm. Thus, the ratio "$d_2/R_{t2}$" was approximately 7.9.

The thickness of the glass substrate, the diameter of the opening of the through hole and the like in each step when manufacturing the glass substrates of example 1 to example 5 are illustrated in Table 1.

(Results)

The configuration of the second through hole was observed for the glass substrate manufactured in each example as described above. More specifically, the diameter "$R_c$" of a narrow portion whose cross-section in a plane that is perpendicular to a longitudinal direction of the second through hole is the minimum was measured for each example.

Results are illustrated in Table 2. For all of the glass substrates of example 1 to example 5, a narrow portion of the second through hole was formed at substantially a center portion of the through hole in its longitudinal direction.

TABLE 2

| EXAMPLE | $R_c$ (µm) | $R_c/R_{t2}$ |
| --- | --- | --- |
| 1 | 26.0 | 0.56 |
| 2 | 30.6 | 0.67 |
| 3 | 30.8 | 0.66 |
| 4 | 21.9 | 0.48 |
| 5 | 17.7 | 0.39 |

From the results, it was revealed that the diameter "$R_c$" of the narrow portion of the second through hole was extremely small in example 5, and the ratio "$R_c/R_{t2}$" was less than 0.4. For example 4, the diameter "$R_c$" of the narrow portion of the second through hole was enlarged compared with that of example 5. Furthermore, the diameter "$R_c$" of the narrow portion of the second through hole was significantly enlarged in each of example 1 to example 3, and the ratio "$R_c/R_{t2}$" was greater than 0.5.

As such, by performing the two etching steps, generation of a distinguishing middle portion can be suppressed. Furthermore, by performing the two etching steps, and making the ratio "$d_1/R_{t1}$" of the thickness "$d_1$" of the glass substrate with respect to the diameter "$R_{t1}$" of the first opening of the first through hole after the first etching step to be within a range between 10 to 20, it was confirmed that a through hole with a relatively desired shape was formed.

According to the embodiment, a method of manufacturing a glass substrate that has a through hole with a desired shape, a method of forming a through hole with a desired shape in a glass substrate and a system for manufacturing a glass substrate that has a through hole with a desired shape are provided.

Although a preferred embodiment of the method of manufacturing the glass substrate that has the through hole, the method of forming the through hole in the glass substrate and the system for manufacturing the glass substrate that has the through hole has been specifically illustrated and described, it is to be understood that minor modifications

TABLE 1

| EXAMPLE | AFTER LASER IRRADIATION | | | | AFTER FIRST ETCHING STEP | | | | AFTER SECOND ETCHING STEP | | | |
| --- | --- | --- | --- | --- | --- | --- | --- | --- | --- | --- | --- | --- |
|  | $d_0$ (µm) | $R_{t0}$ (µm) | $R_{b0}$ (µm) | $d_0/R_{t0}$ | $d_1$ (µm) | $R_{t1}$ (µm) | $R_{b1}$ (µm) | $d_1/R_{t1}$ | $d_2$ (µm) | $R_{t2}$ (µm) | $R_{b2}$ (µm) | $d_2/R_{t2}$ |
| 1 | 400 | 13 | 3 | 30.8 | 390 | 25.1 | 10.4 | 15.6 | 360 | 46.3 | 33.8 | 7.8 |
| 2 | 400 | 13 | 3 | 30.8 | 385 | 28.7 | 15.6 | 13.4 | 360 | 46.0 | 34.3 | 7.8 |
| 3 | 400 | 13 | 3 | 30.8 | 370 | 36.8 | 23.1 | 10.0 | 360 | 46.4 | 33.3 | 7.8 |
| 4 | 400 | 13 | 3 | 30.8 | 395 | 18.9 | 7.6 | 20.9 | 360 | 45.6 | 34.0 | 7.9 |
| 5 | 400 | 13 | 3 | 30.8 | — | — | — | — | 360 | 45.6 | 32.7 | 7.9 | may be made therein without departing from the spirit and scope of the invention as defined by the claims.

The present invention is not limited to the specifically disclosed embodiments, and numerous variations and modifications may be made without departing from the spirit and scope of the present invention.

What is claimed is:

1. A method of manufacturing a glass substrate that has a through hole, the method comprising:
   (1) forming an initial hole in a glass substrate, having first and second surfaces opposing each other, by irradiating laser light from a first surface side of the glass substrate;
   (2) performing a first etching on the glass substrate using a first etching solution to form, from the initial hole, a first through hole that extends from a first opening formed at the first surface to a second opening formed at the second surface, and to make a ratio $d_1/R_{t1}$ of a thickness $d_1$ of the glass substrate with respect to a diameter $R_{t1}$ of the first opening to be within a range of from 10 to 15.6, wherein $d_1$ is a thickness of the substrate after the performing of the first etching; and
   (3) after the performing of the first etching (2), performing a second etching on the glass substrate to enlarge the first through hole using a second etching solution, whose etching rate with respect to the glass substrate is faster than an etching rate of the first etching solution with respect to the glass substrate,
   wherein a ratio $V_2/V_1$ of an etching rate $V_2$ of the second etching solution with respect to an etching rate $V_1$ of the first etching solution is at least 3.

2. The method according to claim 1, wherein an etching rate $V_1$ of the first etching solution is less than or equal to 0.5 μm/minute.

3. The method according to claim 1, wherein an etching rate $V_2$ of the second etching solution is from 1 μm/minute to 5 μm/minute.

4. The method according to claim 1, wherein the thickness $d_1$ is less than a thickness of the glass substrate before the performing of the first etching (2).

5. The method according to claim 1, wherein a thickness $d_0$ of the glass substrate before the performing the (2) is at least 0.3 mm.

6. The method according to claim 1, wherein a thickness $d_0$ of the glass substrate before the performing of the first etching (2) is less than or equal to 0.5 mm.

7. The method according to claim 1, wherein a ratio $d_0/R_{t0}$ of a thickness $d_0$ of the glass substrate before the performing of the first etching (2) with respect to a diameter $R_{t0}$ of an opening of the initial hole at the first surface is at least 25.

8. The method according to claim 1, wherein the initial hole formed in (1) is a through hole or a line of voids.

9. The method according to claim 1, wherein the ratio $d_1/R_{t1}$ is from 10 to 15.

10. The method according to claim 1, wherein the ratio $d_1/R_{t1}$ is from 13.4 to 15.6.

11. The method claim 1,
    wherein the etching rate $V_1$ is an etching rate of the first etching of the glass substrate when a thickness of the substrate changes from $d_0$ to $d_1$, wherein the thickness $d_0$ is a thickness of the glass substrate before the performing of the first etching, and
    wherein the etching rate $V_2$ is an etching rate of the second etching of the glass substrate when a thickness of the substrate changes from $d_1$ to $d_2$, wherein the thickness $d_2$ is a thickness of the glass substrate after the performing of the second etching.

12. A method forming a through hole in a glass substrate, the method comprising:
    (1) forming an initial hole in a glass substrate, having first and second surfaces opposing each other, by irradiating laser light from a first surface side of the glass substrate;
    (2) performing a first etching on the glass substrate using a first etching solution to form, from the initial hole, a first through hole that extends from a first opening formed at the first surface to a second opening formed at the second surface, and to make a ratio $d_1/R_{t1}$ of a thickness $d_1$ of the glass substrate with respect to a diameter $R_{t1}$ of the first opening to be within a range of from 10 to 15.6, wherein $d_1$ is a thickness of the substrate after the performing of the first etching; and
    (3) after the performing of the first etching (2), performing a second etching on the glass substrate to enlarge the first through hole using a second etching solution, whose etching rate with respect to the glass substrate is faster than an etching rate of the first etching solution with respect to the glass substrate,
    wherein a ratio $V_2/V_1$ of an etching rate $V_2$ of the second etching solution with respect to an etching rate $V_1$ of the first etching solution is 10 or more.

13. The method according to claim 12, wherein an etching rate $V_2$ of the second etching solution is from 1 μm/minute to 5 μm/minute.

14. The method according to claim 12, wherein the ratio $d_1/R_{t1}$ is from 10 to 15.

15. The method according to claim 12, wherein the ratio $d_1/R_{t1}$ is from 13.4 to 15.6.

16. The method claim 12,
    wherein the etching rate $V_1$ is an etching rate of the first etching of the glass substrate when a thickness of the substrate changes from $d_0$ to $d_1$, wherein the thickness $d_0$ is a thickness of the glass substrate before the performing of the first etching, and
    wherein the etching rate $V_2$ is an etching rate of the second etching of the glass substrate when a thickness of the substrate changes from $d_1$ to $d_2$, wherein the thickness $d_2$ is a thickness of the glass substrate after the performing of the second etching.

* * * * *